(12) United States Patent
Kim et al.

(10) Patent No.: US 11,521,778 B2
(45) Date of Patent: Dec. 6, 2022

(54) COIL SUBSTRATE

(71) Applicant: LG ELECTRONICS INC., Seoul (KR)

(72) Inventors: Hyungjun Kim, Seoul (KR); Kyungsoo Hwangbo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 871 days.

(21) Appl. No.: 16/344,767

(22) PCT Filed: Oct. 20, 2017

(86) PCT No.: PCT/KR2017/011698
§ 371 (c)(1),
(2) Date: Apr. 24, 2019

(87) PCT Pub. No.: WO2018/088718
PCT Pub. Date: May 17, 2018

(65) Prior Publication Data
US 2019/0333671 A1    Oct. 31, 2019

(30) Foreign Application Priority Data
Nov. 9, 2016  (KR) .................. 10-2016-0148639

(51) Int. Cl.
*H05B 6/36* (2006.01)
*H05B 6/40* (2006.01)
(Continued)

(52) U.S. Cl.
CPC .......... *H01F 17/0006* (2013.01); *H01F 5/003* (2013.01); *H05B 6/36* (2013.01);
(Continued)

(58) Field of Classification Search
CPC ......... H01F 17/0006; H01F 2017/0073; H01F 5/003; H05B 2206/022; H05B 6/1272;
(Continued)

(56) References Cited

U.S. PATENT DOCUMENTS

| 5,744,896 A | 4/1998 | Kessinger, Jr. et al. |
| 6,028,395 A | 2/2000 | Holland et al. |

(Continued)

FOREIGN PATENT DOCUMENTS

| KR | 10-2000-0016004 | 3/2000 |
| KR | 10-2001-0024018 | 3/2001 |

(Continued)

OTHER PUBLICATIONS

International Search Report (with English Translation) and Written Opinion dated Jan. 29, 2018 issued in Application No. PCT/KR2017/011698.

*Primary Examiner* — Quang T Van
(74) *Attorney, Agent, or Firm* — KED & Associates

(57) ABSTRACT

The coil substrate may include a substrate; a first conductor layer including a plurality of first and second segments periodically disposed on a top and a bottom of the substrate; a second conductor layer including a plurality of first and second segments periodically overlapping the first conductor layer on the top and the bottom of the substrate; a first connection line that connects the first and second segments of the first conductor layer; and a second connection line that connects the first and second segments of the second conductor layer. The first connection line includes a first region exposed on at least one of first and second surfaces that are opposite to each other of the substrate and second and third regions disposed through the substrate from both sides of the first region.

19 Claims, 2 Drawing Sheets

(51) Int. Cl.
  *H01F 17/00* (2006.01)
  *H01F 5/00* (2006.01)
  *H05K 1/16* (2006.01)
  *H05B 6/44* (2006.01)
(52) U.S. Cl.
  CPC ..... *H05K 1/165* (2013.01); *H01F 2017/0073* (2013.01); *H05B 6/362* (2013.01); *H05B 6/44* (2013.01); *H05K 2201/09209* (2013.01)
(58) Field of Classification Search
  CPC . H05B 6/36; H05B 6/362; H05B 6/44; H05K 1/165; H05K 2201/09063; H05K 2201/09209; H05K 2201/09672; H05K 2201/097; Y02B 40/00
  USPC ....... 219/672, 635, 645, 633, 646, 653, 673, 219/674, 656, 660, 654, 676; 336/222, 336/147, 192, 200, 223, 232; 257/40
  See application file for complete search history.

(56) References Cited

U.S. PATENT DOCUMENTS

| 7,973,635 B2* | 7/2011 | Baarman ................. H01F 5/003 336/200 |
| 8,963,145 B2* | 2/2015 | Lee ....................... H01L 27/323 257/40 |
| 2009/0020525 A1 | 1/2009 | Loveless et al. |
| 2009/0085706 A1 | 4/2009 | Baarman et al. |

FOREIGN PATENT DOCUMENTS

| KR | 10-2010-0057782 | 6/2010 |
| KR | 10-2010-0057877 | 6/2010 |
| KR | 10-2016-0115266 | 10/2016 |

\* cited by examiner

COIL SUBSTRATE

CROSS-REFERENCE TO RELATED PATENT APPLICATIONS

This application is a U.S. National Stage Application under 35 U.S.C. § 371 of PCT Application No. PCT/KR2017/011698, filed Oct. 20, 2017, which claims priority to Korean Patent Application No. 10-2016-0148639, filed Nov. 9, 2016, whose entire disclosures are hereby incorporated by reference.

TECHNICAL FIELD

An embodiment relates to a coil substrate.

BACKGROUND ART

Generally, in induction heating cooker, eddy current flows when a magnetic force line generated from a working coil passes through a cooking container, and the cooking container itself is induction-heated to be cooked. The induction heating cooker is provided with a coil substrate including a working coil. The conventional coil substrate is disclosed in the publication No. 10-2010-0057877 (referred to as prior art 1) and in the registration number 1991-013724 (referred to as prior art 2). However, in the prior art 1, the respective conductor layers are connected to each other through via-holes, such that a temperature rise such as inter-layer heat generation occurs. In addition, a process of punching via holes is added to complicate the fabrication of the substrate and increase the process cost. Further, in the prior art 2, there is a problem that a temperature rise such as inter-layer heat generation occurs due to the laminated structure in which each coil is arranged in each layer.

DISCLOSURE

Technical Problem

The embodiments are directed to solving the above problems and other problems.

Another object of the embodiment is to provide a coil substrate capable of effectively suppressing heat generation.

Another object of an embodiment is to provide a coil substrate that is simple in structure and low in process cost.

Technical Solution

According to an aspect of an embodiment for achieving the above or other objects, a coil substrate includes a substrate; a first conductor layer comprising a plurality of first and second segments periodically disposed on top and bottom of the substrate; a second conductor layer comprising a plurality of first and second segments periodically overlapping the first conductor layer on the top and bottom of the substrate; a first connection line connecting between the first and second segments of the first conductor layer; and a second connection line connecting the first and second segments of the second conductor layer. The first connection line includes a first region exposed on at least one of the first and second surfaces that are opposite to each other of the substrate and second and third regions disposed through the substrate from both sides of the first region.

Advantageous Effects

The effect of the coil substrate according to the embodiment will be described as follows.

According to at least one of the embodiments of the present invention, since the first and second connection lines are directly mounted on the substrate, an additional process such as a punching process for a via hole or a conductor-forming process for a via hole is not required The structure is simple and the process cost can be reduced.

According to at least one of the embodiments of the embodiments, the heat generated in the first and second conductor layers by the openings formed in the substrate between the segments can be easily released, and the heat generated by the first and second conductor layers can be prevented.

Further scope of applicability of the present invention will become apparent from the following detailed description. It should be understood, however, that the detailed description and specific examples, such as the preferred embodiments of the invention, are given by way of illustration only, since various changes and modifications within the spirit and scope of the invention will be apparent to those skilled in the art.

MODE FOR INVENTION

Figure 1:
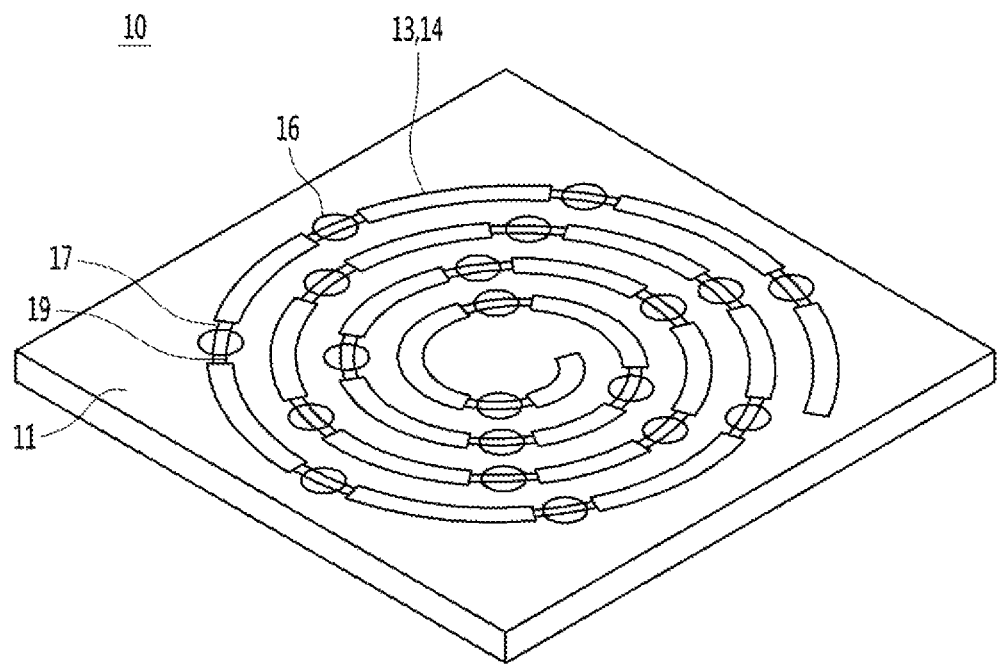
FIG. 1 is a view showing a coil substrate according to an embodiment.

Hereinafter, embodiments of the present invention will be described in detail with reference to the accompanying drawings, wherein like reference numerals are used to designate identical or similar elements, and redundant description thereof will be omitted. The suffix "module", "unit" and "part" for the components used in the following description are given or mixed in consideration of ease of specification, and do not have their own meaning or role. In the following description of the embodiments of the present invention, a detailed description of related arts will be omitted when it is determined that the gist of the embodiments disclosed herein may be blurred. The accompanying drawings are included to provide a further understanding of the invention and are incorporated in and constitute a part of this specification, and it is to be understood that the invention is intended to cover all modifications, equivalents, and alternatives falling within the spirit and scope of the invention.

FIG. 1 is a view showing a coil substrate according to an embodiment.

Referring to FIG. 1, a coil substrate 10 according to an embodiment includes a substrate 11 and first and second conductor layers 13 and 14 alternately disposed on top and bottom of the substrate 11.

The coil substrate 10 may be mounted to, but not limited to, an induction heating cooker, for example, for heating a cooking container.

For example, the first conductor layer 13 may be alternately arranged on the top and bottom of the substrate 11 by sections. For example, the second conductor layer 14 may be alternately arranged on the top and bottom of the substrate 11 by sections.

Specifically, the first conductor layer 13 includes a plurality of first segments 13a disposed on the top of the substrate 11 by sections and spaced apart from each other, and a plurality of second segments 13b disposed on the bottom of the substrate 11 by sections and spaced apart from each other.

The second conductor layer 14 includes a plurality of first segments 14a disposed on the top of the substrate 11 by sections and spaced apart from each other and overlapping the second segment 13b of the first conductor layer 13, and a plurality of second segments 14b disposed on the bottom of the substrate 11 by sections and spaced apart from each other and overlapping the first segment 13a of the first conductor layer 13. The widths of the sections may be the same but are not limited thereto. The first segment 13a of the first conductor layer 13 is disposed on the top of the substrate 11 for the width of the first section and the second segment 13b of the first conductor layer 13 is disposed on the bottom of the substrate 11 for the second section. The first segment 13a of the first conductor layer 13 is disposed on the top of the substrate 11 for the width of the third section and the first conductor layer 13a of the first conductor layer 13 is disposed on the bottom of the substrate 11 for the width of the fourth section.

In this manner, by making the widths of the sections equal, the first segment 13a of the first conductor layer 13 and the second segment 14b of the second conductor layer 14 and/or the second segment 13b of the first conductor layer 13 and first segment 14a of the second conductor layer 14 overlap each other in each section to form a pair, substantially the same time is spent, such that substantially the same effect as the mutual inductance of the first and second conductor layers 13 and 14 can be realized.

Each of the first and second conductor layers 13 and 14 may have a spiral-shaped structure. For example, the first conductor layer 13 may be spirally formed along the lateral direction from one end. The second conductor layer 14 may be formed spirally along the lateral direction from one end. The first and second conductor layers 13 and 14 are wound according to a same direction.

Each of the first and second conductor layers 13 and 14 may be an electrical conductor.

Each of the first and second conductor layers 13 and 14 may be, but is not limited to, Litz wire.

Each of the first and second conductor layers 13 and 14 may be provided with first and second connection lines 17 and 19 to connect an upper portion to a lower portion, respectively.

The first and second connection lines 17 and 19 may be jumper, but are not limited thereto.

The jumper may connect the first and second segments 13a, 13b, 14a, and 14b of the first and second conductor layers 13 and 14 using SMD (surface mount device) equipment. The jumper may be an electrical conductor. The first and second connection lines 17 and 19 may be made of the same materials or different materials as materials of the first and second conductor layers 13 and 14.

Figure 2:
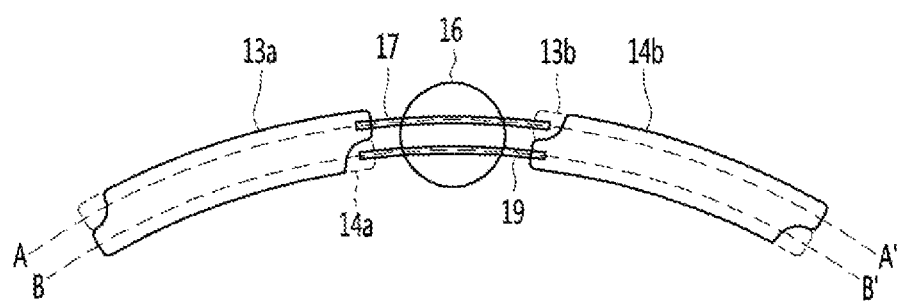
FIG. 2 is a detailed view of FIG. 1.

For example, the first and second connection lines 17 and 19 may be arranged to penetrate from the bottom to the top of the substrate 11. Therefore, one end and the other end of each of the first and second connection lines 17 and 19 can be disposed on the upper portion. As shown in FIG. 2, when viewed from above, the first connection line 17 and the second connection line 19 are spaced apart from each other and can be electrically insulated.

The detailed connection structure of the first and second connection lines 17 and 19 will be described later in detail.

An opening 16 may be disposed between the first and second segments 13a, 13b, 14a, and 14b of the first and second conductor layers 13 and 14, respectively. The opening 16 may be formed through the lower portion of the substrate 11 from the upper portion or through the upper portion from the lower portion. Thus, when viewed from above the substrate 11, objects present below the bottom of the substrate 11 through the opening 16 can be seen.

In FIG. 1, the opening 16 has a circular shape, but may have another shape such as an ellipse, a square, or the like.

The structure of the first and second conductor layers 13 and 14 will be described in more detail with reference to FIGS. 2 and 3.

Figure 3A:
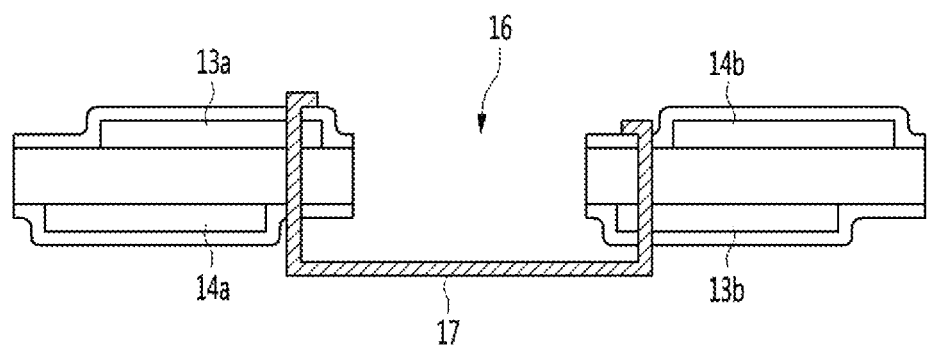
FIG. 3A is a cross-sectional view taken along the line A-A' of FIG. 2.
Figure 3B:
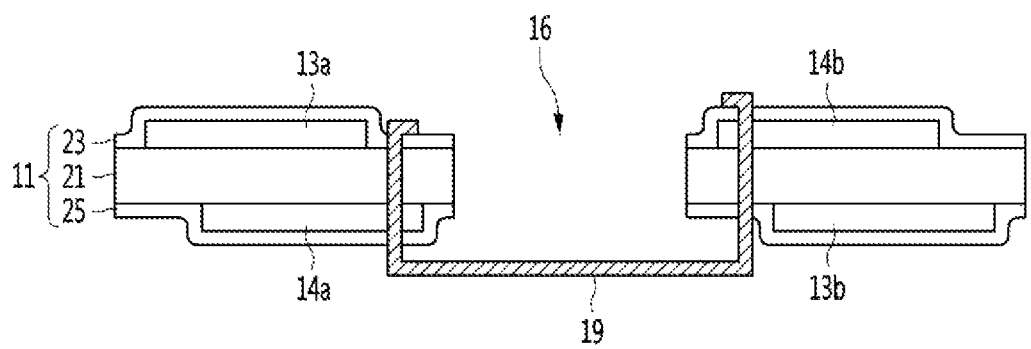
FIG. 3B is a cross-sectional view taken along the line B-B' in FIG. 2.

FIG. 2 is a detailed view of FIG. 1, FIG. 3A is a cross-sectional view taken along line A-A' of FIG. 2, and FIG. 3B is a cross-sectional view taken along line B-B' of FIG. 2.

Referring to FIGS. 2 and 3, the substrate 11 includes a base substrate 21, a first protective layer 23 disposed on the top of the base substrate 21, and a second protective layer 25 disposed on the bottom of the base substrate 21.

The base substrate 21 may a supporting member and be formed of, for example, a plastic material or a ceramic material excellent in insulation and strength, but is not limited thereto.

The first passivation layer 23 and the second passivation layer 25 may be provided to protect the first and second conductor layers 13 and 14.

For example, each of the first and second conductor layers 13 and 14 may be periodically disposed on the top and bottom of the base substrate 21. The first conductor layer 13 includes a plurality of first segments 13a disposed on the top of the base substrate 21 and spaced apart from each other and a plurality of second segments 13b disposed on the bottom of the base substrate 21 and spaced apart from each other. The second conductor layer 14 may include a second segment 14b disposed on the top of the base substrate 21 and a first segment 14a disposed on the bottom of the base substrate 21.

The first segment 13a of the first conductor layer 13 may be periodically arranged at predetermined sections on the top of the base substrate 21. The second segment 13b of the first conductor layer 13 may be periodically arranged at predetermined sections on the bottom of the base substrate 21. In other words, the first segment 13a of the first conductor layer 13 is disposed on the top of the base substrate 21 in plural, and the second segment 13b of the first conductor layer 13 is disposed on the bottom of the base substrate 21 in plural.

The second segment 14b of the second conductor layer 14 may be periodically arranged at predetermined sections on the top of the base substrate 21. The first segment 14a of the second conductor layer 14 may be periodically arranged at predetermined sections on the bottom of the base substrate 21. In other words, the second segment 14b of the second conductor layer 14 is disposed on top of the base substrate 21 in plural, and the first segment 14a of the second conductor layer 14 is disposed on the base substrate 21 in plural.

A portion of the first segment 13a of the first conductor layer 13 disposed on the top of the base substrate 21 overlaps a portion of the first segment 14a of the second conductor layer 14 with the base substrate 21 therebetween. At this time, the portion of the first segment 13a of the first conductor layer 13 and the portion of the first segment 14a of the second conductor layer 14 may form a pair.

A portion of the second segment 13b of the first conductor layer 13 disposed on the bottom of the base substrate 21 overlaps a portion of the second conductor layer 14b with the base substrate 21 therebetween. At this time, the portion of the second segment 13b of the first conductor layer 13 and the portion of the second segment 14b of the second conductor layer 14 may constitute a pair.

The first and second segments 13a and 13b of the first conductor layer 13 and the first and second segments 14a and 14b of the second conductor layer 14 may all have the same pattern length or different pattern length.

Although the first and second segments 13a and 13b of the first conductor layer 13 and the first and second segments 14a and 14b of the second conductor layer 14 have different pattern lengths from each other, the first segment 13a of the first conductor layer 13 and the first segment 14a of the second conductor layer 14 corresponding to the first segment 13a of the conductor layer 13 partly overlap with each other with the base substrate 21 therebetween. In addition, the second segment 13b of the first conductor layer 13 and the second segment 14b of the second conductor layer 14 corresponding to the second segment 13b of the first conductor layer 13 partly overlap with each other with the base substrate 21 therebetween.

The first segment 13a of the first conductor layer 13 and the second segment 14b of the second conductor layer 14 may be periodically disposed on top of the base substrate 21. The second segment 13b of the first conductor layer 13 and the first segment 14a of the second conductor layer 14 may be periodically disposed on the bottom of the base substrate 21.

As the first segment 13a of the first conductor layer 13 and the second segment 14b of the second conductor layer 14 or the second segment 13b of the first conductor layer 13 and the first segment 14a of the second conductor layer 14 is periodically disposed, it consumes substantially the same amount of total time for the first and second conductor layers 13 and 14. While the first and second conductor layers 13 and 14 follow a substantially repeating waveform. The waveform can be made sufficiently frequent to block substantially the same amount of magnetic flux lines due to the periodic pair arrangement of the first and second conductor layers 13 such that substantially the same amount of power is induced inductively and a substantially equal amount of inductance is generated. The number of times the first and second segments 13a and 13b of the first conductor layer 13 are disposed on the base substrate 21 or the number of the first and second segments 14a and 14b of the second conductor layer 14, 14b may be varied depending on the design method, and the embodiment is not limited to this.

The first protective layer 23 may be disposed on the first segment 13a of the first conductor layer 13 and the second segment 14b of the second conductor layer 14. The first protective layer 23 can protect the first segment 13a of the first conductor layer 13 and the second segment 14b of the second conductor layer 14 from external foreign matter or impact and it is isolated between the first segment 13a of the first conductor layer 13 and the second segment 14b of the second conductor layer 14.

The second protective layer 25 may be disposed under the first segment 14a of the second conductor layer 14 and the second segment 13b of the first conductor layer 13. The second protective layer 25 can protect the second segment 13b of the first conductor layer 13 and the first segment 14a of the second conductor layer 14 from external foreign matter or impact and it is isolated between the second segment 13b of the first conductor layer 13 and the first segment 14a of the second conductor layer 14.

The first and second protective layers 23 and 25 may be formed of an organic material or an inorganic material having excellent insulating properties.

Openings 16 may be provided along a length direction of the first conductor layer 13 and the second conductor layer 14. The openings 16 are periodically perforated.

Specifically, the base substrate 21, the first and second protective layers 23 and 25 can be passed through the opening 16 in the vertical direction.

Heat generated in the first and second conductor layers 13 and 14 can be easily dissipated by the opening 16 such that the problem about the heat generated by the first and second conductor layers 13 and 14 can be resolved.

The diameter or size of the opening 16 is preferably large to increase the ability of the opening 16 to discharge.

For example, the diameter of the opening 16 may be at least greater than the width of each of the first and second conductor layers 13 and 14. For example, the diameter of the opening 16 may be one to three times larger than the width of each of the first and second conductor layers 13 and 14, but this is not limiting.

Although not shown, adjacent openings 16 may be connected to each other. In other words, adjacent openings 16 may be formed as opening lines which are connected and formed along a specific direction. The heat generated by the first and second conductor layers 13 and 14 can be more easily dissipated by the opening line.

The segments 13a, 1b, 14a, 14b, which are spaced apart from each other, may be connected by a first connection line 17 and/or a second connection line 19. For example, a first connection line 17 may be connected between the first segment 13a and the second segment 13b, which are periodically arranged to form a first filament. For example, a second connection line 19 may be connected between the periodically arranged first segment 14a and the second segment 14b to form a second filament. Here, each of the first filament and the second filament may be a current flow path.

Thus, the first filament and the second filament take the same time on the upper portion of the base substrate 21 in the current flow path, such that a periodically repeated current waveform can be generated while consuming a substantially equal amount of the entire time. Accordingly, it is possible to generate a uniform magnetic field in the entire upper portion of the base substrate 21.

A portion (first region) of each of the first and second connection lines 17 and 19 can be exposed at least on the bottom of the base substrate 21. Alternatively, a portion of each of the first and second connection lines 17 and 19 may be arranged to be exposed on the top of the base substrate 21.

One side (second region) of each of the first and second connection lines 17 and 19 can be exposed on the top of the first protective layer through a first region of the second protective layer 25, a first region of the base substrate 21, and a first region of the first protective layer 23, The first protective layer 23 may be exposed through the first region of the first protective layer 23. The other side (third region) of each of the first and second connection lines 17 and 19 can be exposed on the second region of the second protective layer 25 through a second region of the second protective layer 25, a second region of the base substrate 21 and a second region of the first protective layer 23.

As shown in FIG. 3A, one side of the second connection line 19 is electrically connected to the first segment 14a of the second conductor layer 14 disposed below the bottom of the base substrate 21, and the other side of the second connection line 19 is electrically connected to the second segment 14b of the second conductor layer 14 disposed on the base substrate 21 while penetrating the base substrate 21.

One side (second region) of the first connection line 17 is bent at the top of the first protective layer 23 disposed on the base substrate 21 and extends toward a direction of the other side (third region) of the first connection line 17 that faces a top surface of the first protective layer 23. The other side (third region) of the first connection line 17 is bent at the top of the first protective layer 23 disposed on the base substrate 21 and extends toward a direction of one side (second region) of the first connection line 17 that faces a top surface of the first protective layer 23.

One side (second region) of the second connection line 19 is bent at the top of the first protective layer 23 disposed on the base substrate 21 and extends toward a direction of the other side (third region) of the second connection line 19 that faces a top surface of the first protective layer 23. The other side (third region) of the second connection line 19 is bent at the top of the first protective layer 23 disposed on the base substrate 21 and extends toward a direction of one side (second region) of the second connection line 19 that faces a top surface of the first protective layer 23.

As described above, both ends of the first connection line 17 and/or both ends of the second connection line 19 (both ends of the first region) are bent and fixed on the first protection layer 23 such that the first connection line 17 is rigidly connected to the first segment 13a and the second segment 13b of the first conductor layer 13 and the second connection line 19 is rigidly connected to the first segment 14a and the second segment 14b of the second conductor layer 14.

FIGS. 3A and 3B illustrate that the first and second connection lines 17 and 19 pass through from the bottom to the bottom of the base substrate 21 in the process.

In this manner, the process may be performed such that the first and second connection lines 17 and 19 pass through the upper portion of the base substrate 21 in the downward direction.

Since the first and second connection lines 17 and 19 of the embodiment are directly mounted on the substrate 11 by using the SMD equipment, the additional processes such as the punching process for the via hole and the conductor forming process for the via hole are not required such that the structure is simple and the process cost can be made low.

The foregoing detailed description should not be construed in all aspects as limiting and should be considered illustrative. The scope of the present invention should be determined by rational interpretation of the appended claims, and all changes within the scope of equivalents of the present invention are included in the scope of the present invention.

INDUSTRIAL APPLICABILITY

The coil substrate according to the embodiment can be used in an induction heating cooker.

The invention claimed is:
1. A coil substrate, comprising:
   a substrate;
   a first conductor layer comprising a plurality of first and second segments periodically disposed on a top and a bottom of the substrate;
   a second conductor layer comprising a plurality of first and second segments periodically overlapping the first conductor layer on the top and the bottom of the substrate;
   a first connection line that connects the plurality of first and second segments of the first conductor layer; and
   a second connection line that connects the plurality of first and second segments of the second conductor layer, wherein the first connection line includes a first region exposed on at least one of first and second surfaces of the substrate and a second region disposed through the substrate from both sides of the first region.

2. The coil substrate of claim 1, wherein the plurality of first segments of the first conductor layer is periodically disposed on the top of the substrate, and wherein the plurality of second segments of the first conductor layer is periodically disposed on the bottom of the substrate.

3. The coil substrate of claim 2, wherein the plurality of first segments of the second conductor layer is disposed to overlap periodically with the plurality of first segments of the first conductor layer on the bottom of the substrate, and wherein the plurality of second segments of the second conductor layer is disposed to overlap periodically with the plurality of second segments of the first conductor layer on the substrate.

4. The coil substrate of claim 3, wherein the second connection line includes a first region exposed at least on one of the first and second surfaces of the substrate and a second region disposed through the substrate from both sides of the first region.

5. The coil substrate of claim 4, wherein the first region of the first connection line and the second region of the second connection line are disposed on a same plane of the substrate.

6. The coil substrate of claim 4, wherein the first and second regions of the first connection line and the first and second regions of the second connection line pass through at different locations of the substrate.

7. The coil substrate of claim 4, wherein the second region of the first connection line is electrically connected to the plurality of first segments of the first conductor layer disposed on the substrate, and wherein a third region of the first connection line is electrically connected to the plurality of second segments of the first conductor layer disposed below the bottom of the substrate.

8. The coil substrate of claim 4, wherein the second region of the second connection line is electrically connected to the plurality of first segments of the second conductor layer disposed below the bottom of the substrate, and wherein a third region of the second connection line is electrically connected to the plurality of second segments of the second conductor layer disposed on the substrate.

9. The coil substrate of claim 8, wherein each of the second and third regions of the first connection line is fixed on the other one of the first and second surfaces of the substrate in contact with the first region.

10. The coil substrate of claim 8, wherein each of the second and third regions of the second connection line is fixed on one of the first and second surfaces of the substrate in contact with the first region.

11. The coil substrate of claim 4, further comprising:
   an opening disposed in the substrate between adjacent segments.

12. The coil substrate of claim 11, wherein the diameter of the opening is greater than the width of each of the first and second conductor layers.

13. The coil substrate of claim 12, wherein a diameter of the opening is at least 1 to 3 times greater than a width of each of the first and second conductor layers.

14. The coil substrate of claim 11, wherein adjacent openings are connected to each other.

15. The coil substrate of claim 11, wherein the second region of the first connection line is disposed through the substrate on one side of the opening to be electrically connected to the plurality of first segments of the first conductor layer disposed on the substrate, and wherein the third region of the first connection line is disposed through the substrate on the other side of the opening to be electrically connected to the plurality of second segments of the first conductor layer disposed below the bottom of the substrate.

16. The coil substrate of claim 11, wherein the second region of the second connection line is disposed through the substrate on one side of the opening to be electrically connected to the plurality of first segments of the second conductor layer disposed below the bottom of the substrate, and wherein the third region of the second connection line is disposed through the substrate on the other side of the opening to be electrically connected to the plurality of second segments of the second conductor layer disposed on the substrate.

17. The coil substrate according to claim 1, further comprising:
a first filament formed by the plurality of first and second segments of the first conductor layer and the first connecting line,
a second filament formed by the plurality of first and second segments of the second conductor layer and the second connection line.

18. The coil substrate of claim 17, wherein the substrate includes:
a base substrate;
a first protective layer disposed on the plurality of first segments of the first conductor layer and the plurality of second segments of the second conductor layer disposed on the base substrate; and
a second protective layer disposed below the plurality of second segments of the first conductor layer and the plurality of first segments of the second conductor layer disposed below the base substrate.

19. The coil substrate according to claim 1, wherein the first and second connection lines are jumpers, respectively.

* * * * *